(12) United States Patent
Shen et al.

(10) Patent No.: US 11,700,685 B2
(45) Date of Patent: Jul. 11, 2023

(54) METHOD FOR MANUFACTURING THE SAME

(71) Applicants: Avary Holding (Shenzhen) Co., Limited., Shenzhen (CN); QING DING PRECISION ELECTRONICS (HUAIAN) CO., LTD, Huai an (CN)

(72) Inventors: Fu-Yun Shen, Shenzhen (CN); Xian-Qin Hu, Shenzhen (CN)

(73) Assignees: Avary Holding (Shenzhen) Co., Limited., Shenzhen (CN); QING DING PRECISION ELECTRONICS (HUAIAN) CO., LTD, Huai an (CN)

( * ) Notice: Subject to any disclaimer, the term of this patent is extended or adjusted under 35 U.S.C. 154(b) by 64 days.

(21) Appl. No.: 17/512,901

(22) Filed: Oct. 28, 2021

(65) Prior Publication Data
US 2022/0053629 A1    Feb. 17, 2022

Related U.S. Application Data

(62) Division of application No. 17/029,355, filed on Sep. 23, 2020, now Pat. No. 11,197,368.

(30) Foreign Application Priority Data

Jun. 3, 2020   (CN) .......................... 202010494280.1

(51) Int. Cl.
*H05K 1/09* (2006.01)
*H05K 3/06* (2006.01)
(Continued)

(52) U.S. Cl.
CPC ........... *H05K 1/024* (2013.01); *H05K 1/0219* (2013.01); *H05K 3/4602* (2013.01);
(Continued)

(58) Field of Classification Search
CPC .... H05K 1/024; H05K 1/0216; H05K 1/0219; H05K 1/0242; H05K 1/0237;
(Continued)

(56) References Cited

U.S. PATENT DOCUMENTS 9,485,859 B1 * 11/2016 Hu .................... H05K 1/0219
10,820,457 B1 * 10/2020 Kishi ..................... B32B 15/08
(Continued)

*Primary Examiner* — Xiaoliang Chen
(74) *Attorney, Agent, or Firm* — ScienBiziP, P.C.

(57) ABSTRACT

A circuit board with reduced dielectric losses enabling the movement of high frequency signals includes an inner circuit board and two outer circuit boards. The inner circuit board includes a first conductor layer and a first substrate layer. The first conductor layer includes a signal line and two ground lines on both sides of the signal line. The first substrate layer covers a side of the first conductor layer and defines first through holes which expose the signal line. Each outer circuit board includes a second substrate layer and a second conductor layer. The second substrate layer abuts the inner circuit board and defines second through holes which are not aligned with the first through holes, partially surrounding the signal line with air which has a very low dielectric constant. A method for manufacturing the high-frequency circuit board is also disclosed.

9 Claims, 7 Drawing Sheets

(51) Int. Cl.
*H01L 23/13* (2006.01)
*H05K 1/02* (2006.01)
*H05K 3/46* (2006.01)

(52) U.S. Cl.
CPC ... *H05K 3/4655* (2013.01); *H05K 2201/0723* (2013.01); *H05K 2201/09063* (2013.01)

(58) Field of Classification Search
CPC ........ H05K 1/0298; H05K 1/09; H05K 1/118; H05K 1/144; H05K 3/06; H05K 3/4038; H05K 3/4602; H05K 3/4611; H05K 3/4652; H05K 3/4655; H05K 3/4697; H05K 2201/0154; H05K 2201/0394; H05K 2201/042; H05K 2201/05; H05K 2201/0715; H05K 2201/0723; H05K 2201/09236; H05K 2201/09063; H05K 2201/09618; H01L 21/486; H01L 21/4853; H01L 23/13; H01L 23/145; H01L 23/562; H01L 23/49822; H01L 23/5381; H01L 23/5383; H01L 23/5384; H01L 23/5389
USPC .................................. 174/262, 254; 29/846
See application file for complete search history.

(56) References Cited

U.S. PATENT DOCUMENTS

| | | | |
|---|---|---|---|
| 2016/0381786 A1* | 12/2016 | Hu ...................... | H05K 1/0237 |
| | | | 174/254 |
| 2017/0188451 A1* | 6/2017 | Hu ...................... | H05K 1/0242 |
| 2021/0125932 A1* | 4/2021 | Chavali .................. | H01L 24/16 |
| 2021/0183783 A1* | 6/2021 | Park .................... | H01L 23/5389 |

* cited by examiner

METHOD FOR MANUFACTURING THE SAME

CROSS-REFERENCE TO RELATED APPLICATIONS

This is a divisional application of patent application Ser. No. 17/029,355 filed on Sep. 23, 2020, which is based on and claims priority to China Patent Application No. 202010494280.1 filed on Jun. 3, 2020, the contents of which are incorporated by reference herein.

FIELD

The subject matter herein generally relates to printed circuit boards, in particular to a high-frequency circuit board and a method for manufacturing the same.

BACKGROUND

In high-frequency electronic signal transmissions, attenuation of the transmission signal is mainly a result of dielectric losses. Dielectric loss is positively correlated with dielectric loss factor and dielectric constant. In order to reduce the transmission loss, a liquid crystal polymer with a low dielectric constant can be used as the substrate layer covering the signal line. However, such material still has a relatively high dielectric loss.

BRIEF DESCRIPTION OF THE DRAWINGS

Implementations of the present technology will now be described, by way of embodiment, with reference to the attached figures.

DETAILED DESCRIPTION

Implementations of the disclosure will now be described, by way of embodiments only, with reference to the drawings. The disclosure is illustrative only, and changes may be made in the detail within the principles of the present disclosure. It will, therefore, be appreciated that the embodiments may be modified within the scope of the claims.

Unless otherwise defined, all technical terms used herein have the same meaning as commonly understood by one of ordinary skill in the art. The technical terms used herein are to provide a thorough understanding of the embodiments described herein, but are not to be considered as limiting the scope of the embodiments.

Figure 1:
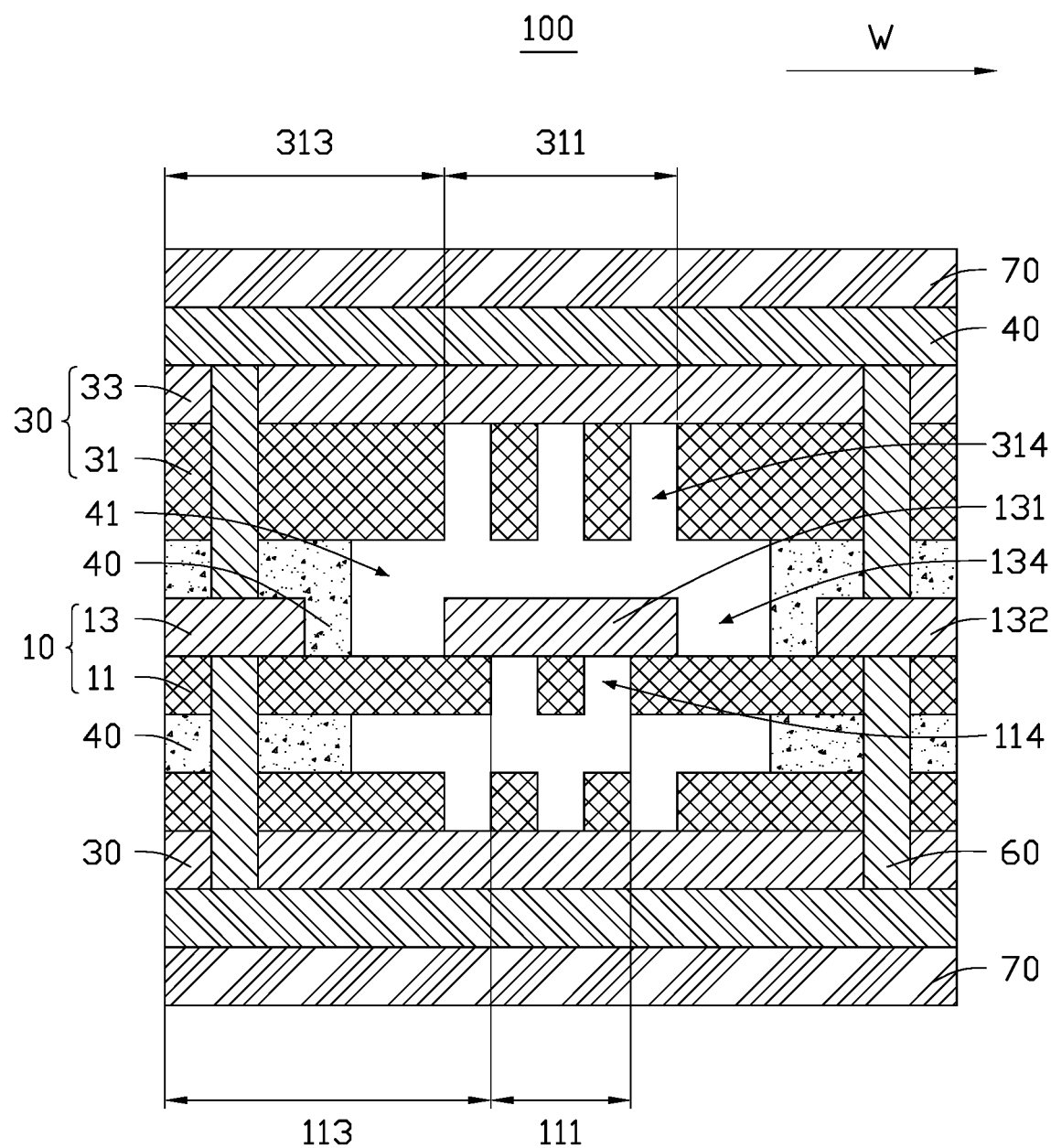
FIG. 1 is a cross-sectional view of an embodiment of a high-frequency circuit board.

FIG. 1 illustrates a high-frequency circuit board 100 according to one embodiment. The high-frequency circuit board 100 includes an inner circuit board 10, and two outer circuit boards 30 disposed on opposite two surfaces of the inner circuit board 10.

The inner circuit board 10 is a single-sided circuit board, and includes a first substrate layer 11 and a first conductor layer 13 disposed on a surface of the first substrate layer 11.

Figure 2A:
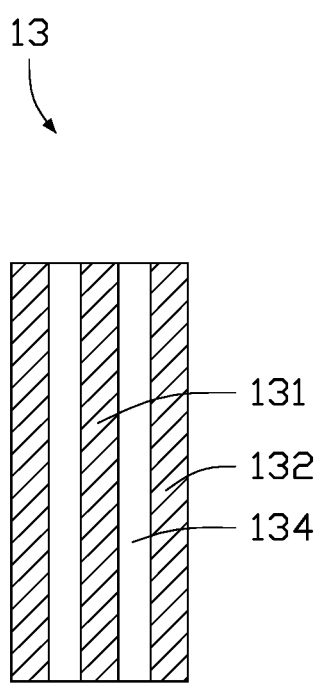
FIG. 2A is a top view of a first conductor layer of the high-frequency circuit board of FIG. 1.

As shown in FIG. 2A, the first conductor layer 13 is made of copper, and includes a signal line 131 and two ground lines 132. The two ground lines 132 are arranged at intervals on both sides of the signal line 131. The first conductor layer 13 defines a plurality of slots 134 passing through the first conductor layer 13. Each slot 134 isolates one ground line 132 from the signal line 131.

Figure 2B:
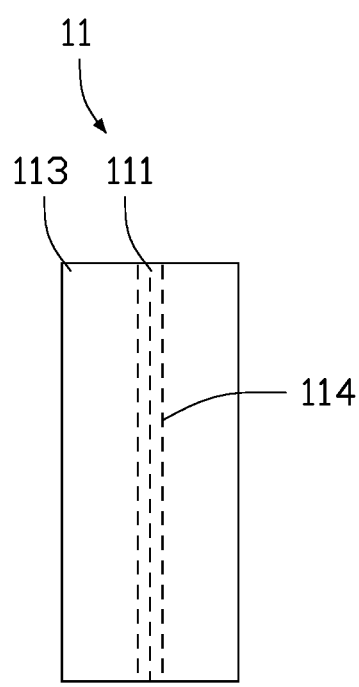
FIG. 2B is a top view of a first substrate layer of the high-frequency circuit board of FIG. 1.

As shown in FIG. 2B, the substrate layer 11 includes a first opening region 111 and a first non-opening region 113 connected to each other. The first opening region 111 corresponds in position to the signal line 131. In a width direction W of the high-frequency circuit board 100, a width of the first opening region 111 is not greater than a width of the signal line 131. The first opening region 111 defines a plurality of first through holes 114, and the signal line 131 is exposed in the first through holes 114. Each of the first through holes 114 penetrates a surface of the first substrate layer 11 abutting the first conductor layer 13 and a surface of the first substrate layer 11 away from the first conductor layer 13. A cross-section of each of the first through holes 114 may be round, slot-like, or the like. The first through holes 114 are arranged at intervals along a length direction of the signal line 131.

The first substrate layer 11 may be a rigid resin layer, such as a prepreg (PP) layer including glass fiber and epoxy resin, or may be a flexible resin layer, such as a polyethylene naphthalate (PEN) layer, a polyimide (PI) layer, a polyethylene terephthalate (PET) layer, a polytetrafluoroethylene (Teflon) layer, a polythiamine (PA) layer, a poly methyl methacrylate (PMMA) layer, a polycarbonate (PC) layer, or a polyimide-polyethylene-terephthalate copolymer layer. In one embodiment, the first substrate layer 11 is made of a material having a dielectric constant of less than 3.5, such as polyethylene naphthalate.

The two outer circuit boards 30 are arranged at outer sides of the first substrate layer 11 and the first conductor layer 13. Each of the two outer circuit boards 30 includes a second substrate layer 31 and a second conductor layer 33. The second substrate layer 31 is in contact with the inner circuit board 10, and the second conductor layer 33 covers a surface of the second substrate layer 31 away from the inner circuit board 10.

Figure 2C:
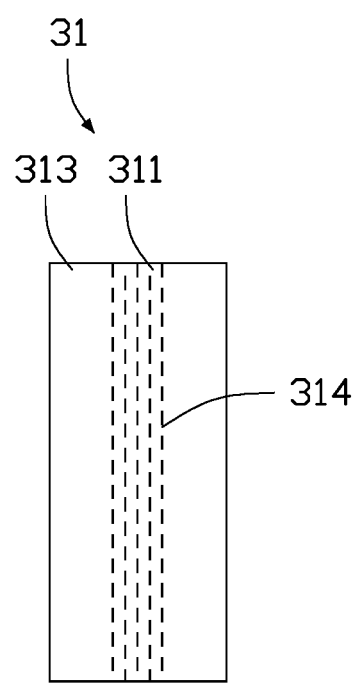
FIG. 2C is a top view of a second substrate layer of the high-frequency circuit board of FIG. 1.

As shown in FIG. 2C, the second substrate layer 31 includes a second opening region 311 and a second non-opening region 313 connected to each other. The second opening region 311 corresponds in position to the signal line 131. In the width direction W of the high-frequency circuit board 100, a width of the second opening region 311 is not less than the width of the signal line 131. The second opening region 311 defines a plurality of second through holes 314, and the signal line 131 is exposed in the second through holes 314. Each of the second through holes 314 penetrates a surface of the second substrate layer 31 abutting the inner circuit board 10 and a surface of the second substrate layer 31 away from the inner circuit board 10. A cross-section of each of the second through holes 314 may be round, or slot-like, or the like. The second through holes 314 are arranged at intervals along a length direction of the signal line 131.

The second through holes 314 are not aligned with the first through holes 114, preventing copper foils of a copper laminate from collapsing during the pressing of the copper laminate on the inner circuit board 10. In one embodiment, in a thickness direction of the high-frequency circuit board 100, projections of the second through holes 314 and projections of the first through holes 114 alternate with each other.

The second substrate layer 31 may be a rigid resin layer or a flexible resin layer. The second substrate layer 31 and the first substrate layer 11 may be made of the same or different materials. In one embodiment, the second substrate layer 31 is made of a material having a dielectric constant of less than 3.5.

In an alternative embodiment, the high-frequency circuit board 100 further includes two adhesive layers 40. The two adhesive layers 40 attach the two outer circuit boards 30 to the inner circuit board 10. One adhesive layer 40 is sandwiched between the first substrate layer 11 and the second substrate layer 31 of one outer circuit board 30, and the other adhesive layer 40 is sandwiched between the first conductor layer 13 and the second substrate layer 31 of the other outer circuit board 30. Each of the adhesive layers 40 defines an opening 41. In the width direction of the high-frequency circuit board 100, a width of the opening 41 is greater than the width of the signal line 131 and is less than a straight-line distance between the two ground lines 132. The signal line 131 is in the opening 41 of one adhesive layer 40, and the adhesive layer 40 partially infills the slots 134.

The second conductor layers 33 function as shielding layers of the signal line 131. The high-frequency circuit board 100 further includes a plurality of conductive pillars 60 on both sides of signal line 131. The conductive pillars 60 are electrically connected to the second conductor layers 33 and the ground lines 132. The conductive pillars 60, the second conductor layers 33, and the ground lines 132 surround the signal line 131 and together act as a shield preventing electromagnetic interference from the environment in the signal line 131. Some conductive pillars 60 located on one side of the signal line 131 are arranged at equal or non-equal distances along the length direction of the signal line 131. In one embodiment, each of the conductive pillars 60 penetrates the first substrate layer 11, two adhesive layers 40, and two second substrate layers 31, and is electrically connected to one ground line 132 and two second conductor layers 33.

The high-frequency circuit board 100 further includes two protective layers 70. The two protective layers 70 are arranged on two outer sides of the two outer circuit boards 30 and protect the second conductor layers 33. In one embodiment, the protective layers 70 are covering layers. In other embodiment, the protective layers 70 may be solder resisting layers. The two protective layers 70 may be attached to the outer sides of the two outer circuit boards 30 by adhesive layers 40.

One embodiment of a method for manufacturing a high-frequency circuit board includes the steps of:

S1, providing an inner circuit board including a first substrate layer and a first conductor layer on a surface of the first substrate layer, the first conductor layer including a signal line and two ground lines arranged at intervals on both sides of the signal line, and the first substrate layer having a plurality of first through holes corresponding to the signal line;

S2, providing two copper clad laminates, each of the two copper clad laminates including a second substrate layer and a copper foil on a surface of the second substrate layer, the second substrate layer having a plurality of second through holes;

S3, pressing together the two copper clad laminates on two sides of the inner circuit board, the second substrate layer abutting the inner circuit board, and the second through holes non-aligned with the first through holes;

S4, forming a second conductor layer on the copper foil to obtain the high-frequency circuit board.

Figure 3:
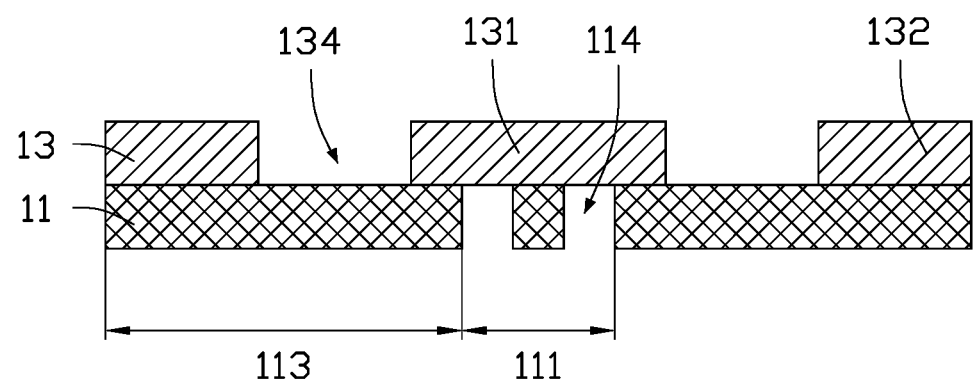
FIG. 3 is a cross-sectional view of an inner circuit board in one embodiment.

As shown in FIG. 3, in step S1, an inner circuit board 10 is provided. The inner circuit board 10 includes a first substrate layer 11 and a first conductor layer 13 disposed on a surface of the first substrate layer 11. The first conductor layer 13 includes a signal line 131 and two ground lines 132. The two ground lines 132 are arranged at intervals on both sides of the signal line 131. The first substrate layer 11 defines a plurality of first through holes 114, and the signal line 131 is exposed in the first through holes 114.

The first conductor layer 13 is made of copper, and includes a signal line 131 and two ground lines 132. The first conductor layer 13 defines slots 134 passing through the first conductor layer 13. Each slot 134 isolates one ground line 132 from the signal line 131. The first substrate layer 11 covers one side of the first conductor layer 13.

The substrate layer 11 includes a first opening region 111 and a first non-opening region 113 connected to each other. The first opening region 111 corresponds in position to the signal line 131. In a width direction W of the high-frequency circuit board 100, a width of the first opening region 111 is not greater than a width of the signal line 131. The first opening region 111 defines first through holes 114, and the signal line 131 is exposed in the first through holes 114. Each of the first through holes 114 penetrates a surface of the first substrate layer 11 abutting the first conductor layer 13 and a surface of the first substrate layer 11 away from the first conductor layer 13. A cross-section of each of the first through holes 114 may be round, slot-like, or the like. The first through holes 114 are arranged at intervals along a length direction of the signal line 131. The first through holes 114 may be formed by laser cutting or punching.

The first substrate layer 11 may be a rigid resin layer, such as a prepreg (PP) layer including glass fiber and epoxy resin, or may be a flexible resin layer, such as a polyethylene naphthalate (PEN) layer, a polyimide (PI) layer, a polyethylene terephthalate (PET) layer, a polytetrafluoroethylene (Teflon) layer, a polythiamine (PA) layer, a poly methyl methacrylate (PMMA) layer, a polycarbonate (PC) layer, or a polyimide-polyethylene-terephthalate copolymer layer. In one embodiment, the first substrate layer 11 is made of a material having a dielectric constant of less than 3.5, such as polyethylene naphthalate.

Figure 4:
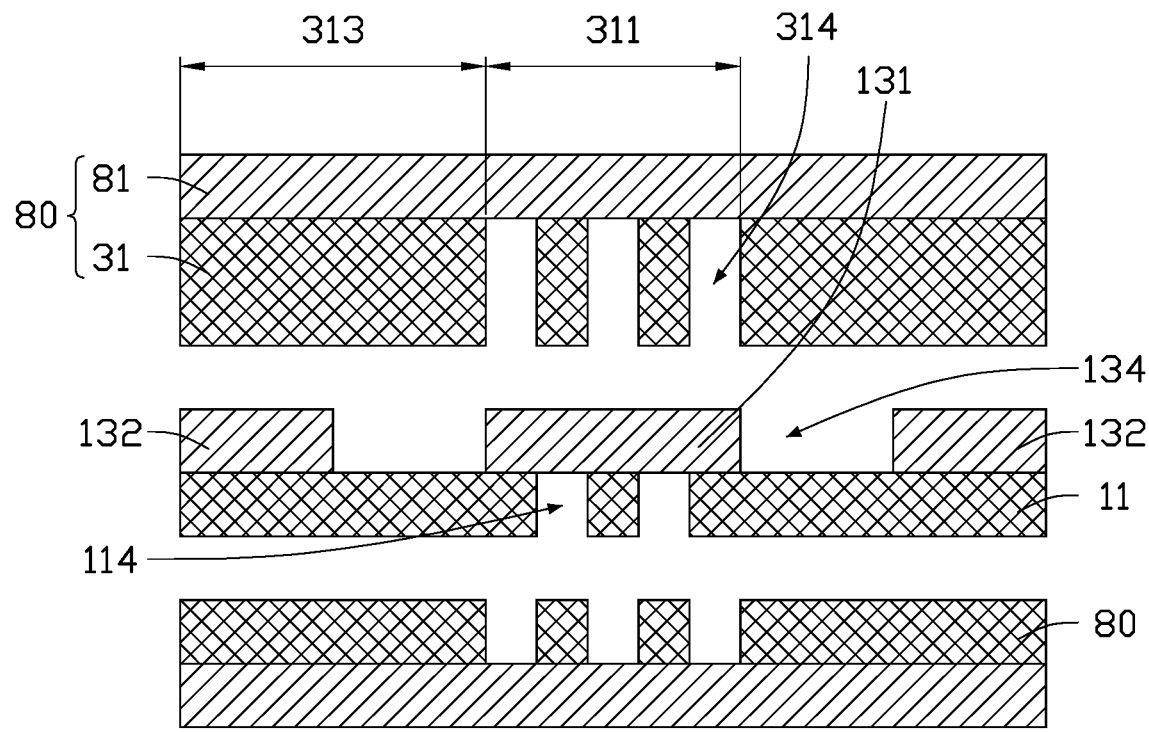
FIG. 4 is a cross-sectional view showing two copper clad laminates provided on two sides of the inner circuit board of FIG. 3.

As shown in FIG. 4, in step S2, two copper clad laminates 80 are provided. Each of the two copper clad laminates 80 includes a second substrate layer 31 and a copper foil 81 on a side of the second substrate layer 31. The second substrate layer 31 has second through holes 314.

The second substrate layer 31 includes a second opening region 311 and a second non-opening region 313 connected to each other. The second opening region 311 corresponds in position to the signal line 131. In the width direction W of the high-frequency circuit board 100, a width of the second opening region 311 is not less than the width of the signal line 131. The second opening region 311 defines second through holes 314. The second through holes 314 may be formed by laser cutting or punching.

The second substrate layer 31 may be a rigid resin layer or a flexible resin layer. The second substrate layer 31 and the first substrate layer 11 may be made of the same or different materials. In one embodiment, the second substrate layer 31 is made of a material having a dielectric constant of less than 3.5.

Figure 5:
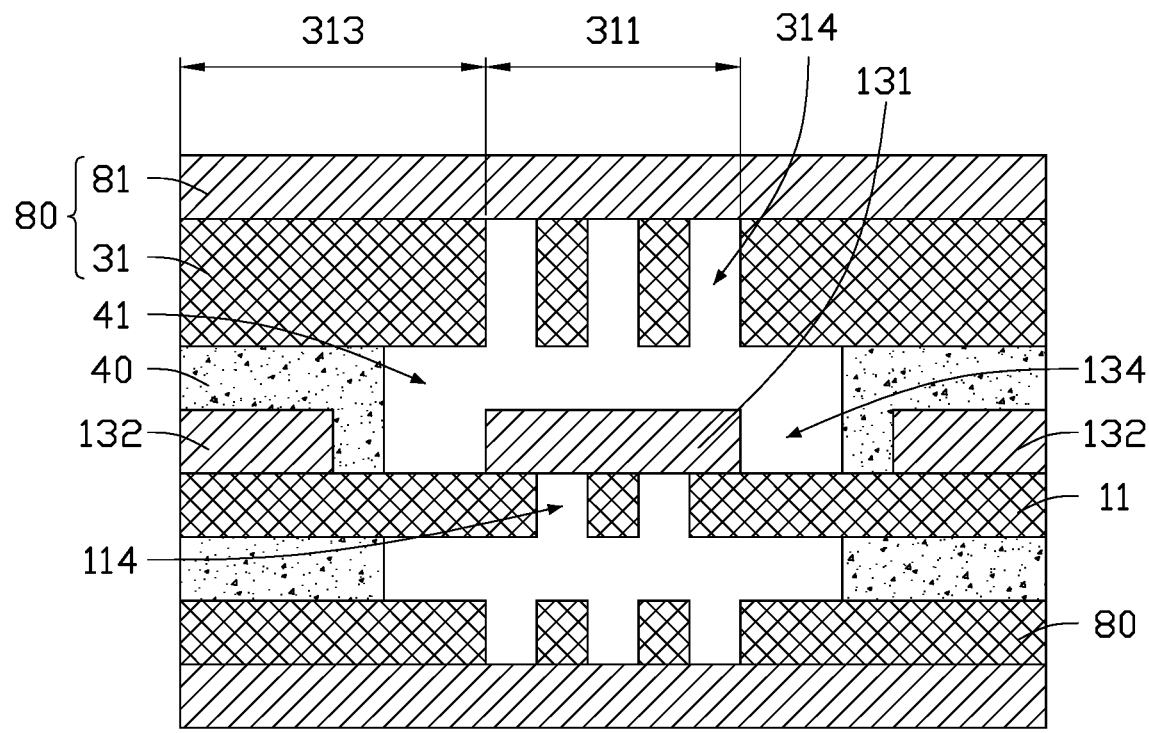
FIG. 5 is a cross-sectional view showing the copper clad laminates and the inner circuit board of FIG. 3 pressed together.

As shown in FIG. 5, the two copper clad laminates 80 are pressed onto opposite two sides of the inner circuit board 10, the second substrate layer 31 abuts the inner circuit board 10, and the second through holes 314 are not aligned with the first through holes 114. In one embodiment, in a thickness direction of the high-frequency circuit board 100, projections of the second through holes 314 and projections of the first through holes 114 alternate with each other.

In an alternative embodiment, the two copper clad laminates 80 are adhered to two sides of the inner circuit board 10 by adhesive layers 40. One adhesive layer 40 is sandwiched between the first substrate layer 11 and the second substrate layer 31 of one outer circuit board 30, and the other adhesive layer 40 is sandwiched between the first conductor layer 13 and the second substrate layer 31 of the other outer circuit board 30. The adhesive layers 40 may be prepregs. Each of the adhesive layers 40 defines an opening 41. In the width direction of the high-frequency circuit board 100, a width of the opening 41 is greater than the width of the signal line 131 but less than a straight-line distance between the two ground lines 132. After being pressed together, the signal line 131 is in the opening 41 of one adhesive layer 40, and the adhesive layer 40 partially infills the slots 134.

Figure 6:
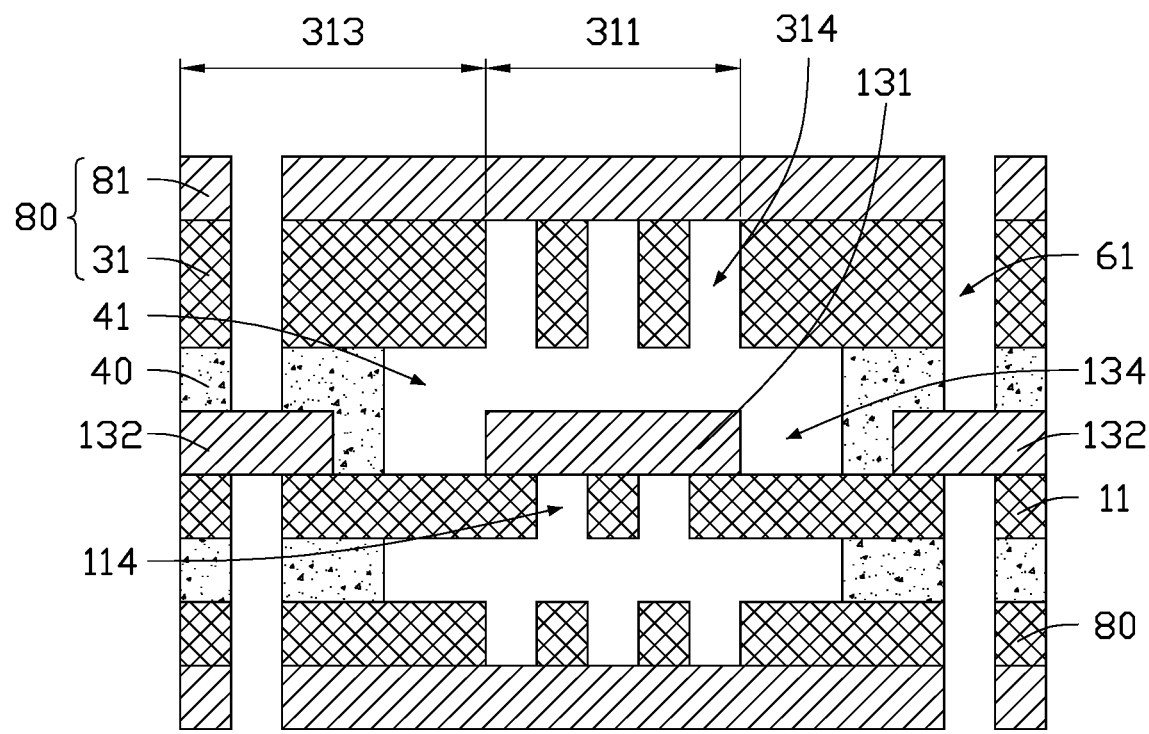
FIG. 6 is a cross-sectional view showing a plurality of vias formed on the structure of FIG. 5.
Figure 7:
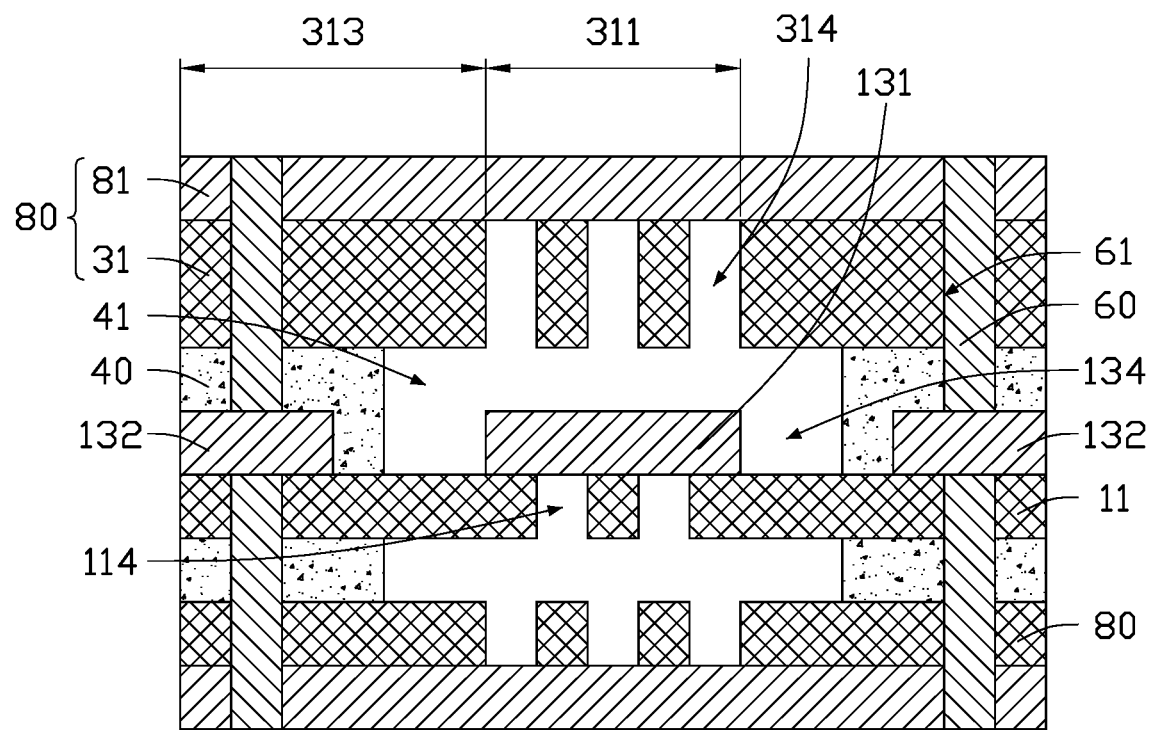
FIG. 7 is a cross-sectional view showing a plurality of conductive pillars formed on the structure of FIG. 6.

As shown in FIGS. 6 and 7, after step S3, the method further includes a step of forming conductive pillars 60. The conductive pillars 60 are located on both sides of signal line 131, and are electrically connected to the ground lines 132 and the copper foils 81 of the copper clad laminates 80.

Specifically, each of the conductive pillars 60 is formed by forming a via 61 on the first substrate 11, the two adhesive layers 40, and the two substrate layers 31, the ground line 132 being exposed in the via 61. The via 61 is infilled or electroplated with conductive materials to form the conductive pillar 60.

As shown in FIG. 1 and FIG. 7, in step S4, two conductor layers 33 are formed on the two copper foils 81 to obtain the high-frequency circuit board 100. The copper foils 81 undergoes a photolithography process to form the second conductor layers 33. One second conductor layer 33 and one second substrate layer 31 constitute one outer circuit board 30.

After forming the second conductor layers 33, the method further includes the step of forming two protective layers 70 on two outer sides of the two outer circuit boards 30. The protective layers 70 protect the second conductor layers 33. In one embodiment, the protective layers 70 are covering layers. In other embodiment, the protective layers 70 may be solder resisting layers. The two protective layers 70 may be attached to the outer sides of the two outer circuit boards 30 by two adhesive layers 40.

In the high-frequency circuit board 100, the first substrate layer 11 of the inner circuit board 10 and the second substrate layers 31 of the outer circuit boards 30 all define through holes corresponding to the signal line 131. The signal line 131 is at least in part surrounded by air, air having a very low dielectric constant, attenuation of the signal line 131 during transmission is thereby reduced. The second through holes 314 are non-aligned with the first through holes 114, so as to prevent the copper foils 81 of the copper laminates 80 from collapsing during the pressing together of the copper laminates 80 on the inner circuit board 10.

While the present disclosure has been described with reference to particular embodiments, the description is illustrative of the disclosure and is not to be construed as limiting the disclosure. Therefore, those of ordinary skill in the art can make various modifications to the embodiments without departing from the scope of the disclosure as defined by the appended claims.

What is claimed is:

1. A method for manufacturing a high-frequency circuit board comprising:
   providing an inner circuit board including a first substrate layer and a first conductor layer on a surface of the first substrate layer, the first conductor layer including a signal line and two ground lines arranged at intervals on both sides of the signal line, the first substrate layer having a plurality of first through holes corresponding to the signal line;
   providing two copper clad laminates, each of the two copper clad laminates comprising a second substrate layer and a copper foil on a surface of the second substrate layer, the second substrate layer having a plurality of second through holes;
   pressing the two copper clad laminates on two sides of the inner circuit board, the second substrate layer abutting the inner circuit board, and the second through holes non-aligned with the first through holes; and
   forming a second conductor layer from the copper foil.

2. The method of claim 1, wherein the two copper clad laminates are adhered on the two sides of the inner circuit board by two adhesive layers, each of the two adhesive layers defines an opening exposing the signal line.

3. The method of claim 2, wherein in a width direction of the high-frequency circuit board, a width of the opening is greater than a width of the signal line and is less than a straight-line distance between the two ground lines.

4. The method of claim 2, wherein one of the two adhesive layers is sandwiched between the first substrate layer and the second substrate layer of one of the two copper clad laminates, and the other layer of the two adhesive layers is sandwiched between the first conductor layer and the second substrate layer of the other of the two copper clad laminates.

5. The method of claim 1, wherein the first substrate layer comprises a first opening region, the plurality of first through holes are located in the first opening region; the second substrate layer comprises a second opening region, the plurality of second through holes are located in the second opening region; in the width direction of the high-frequency circuit board, a width of the first opening region is not greater than the width of the signal line, and a width of the second opening region is not less than the width of the signal line.

6. The method of claim 1, further comprising forming a plurality of conductive pillars after pressing the two copper clad laminates, wherein the plurality of conductive pillars are located on both sides of the signal line, and each of the plurality of conductive pillars electrically connects one of the two ground lines and the copper foil.

7. The method of claim 1, further comprising forming two protective layers on two second conductor layers.

8. The method of claim 1, wherein each of the plurality of first through holes penetrates a surface of the first substrate layer abutting the first conductor layer and a surface of the first substrate layer facing away from the first conductor layer, the plurality of first through holes are arranged at intervals along a length direction of the signal line.

9. The method of claim 1, wherein each of the plurality of second through holes penetrates a surface of the second substrate layer abutting the inner circuit board and a surface of the second substrate layer facing away from the inner circuit board, the plurality of second through holes are arranged at intervals along a length direction of the signal line.

\* \* \* \* \*